United States Patent
Dehé et al.

(10) Patent No.: US 11,879,784 B2
(45) Date of Patent: Jan. 23, 2024

(54) MODELING THE EMISSION INTENSITY OF AN IR EMITTER BY VARYING THE EMISSION SURFACE

(71) Applicant: Hahn-Schickard-Gesellschaft für angewandte Forschung e. V., Villingen-Schwenningen (DE)

(72) Inventors: Alfons Dehé, Reutlingen (DE); Achim Bittner, Heilbronn (DE); Daniel Biesinger, Villingen-Schwenningen (DE)

(73) Assignee: Hahn-Schickard-Gesellschaft für angewandte Forschung e. V., Villingen-Schwenningen (DE)

( * ) Notice: Subject to any disclaimer, the term of this patent is extended or adjusted under 35 U.S.C. 154(b) by 499 days.

(21) Appl. No.: 17/250,852

(22) PCT Filed: Sep. 13, 2019

(86) PCT No.: PCT/EP2019/074516
§ 371 (c)(1),
(2) Date: Mar. 12, 2021

(87) PCT Pub. No.: WO2020/053402
PCT Pub. Date: Mar. 19, 2020

(65) Prior Publication Data
US 2022/0042852 A1 Feb. 10, 2022

(30) Foreign Application Priority Data
Sep. 13, 2018 (EP) .................................... 18194206

(51) Int. Cl.
*G01N 21/17* (2006.01)
*G01J 5/08* (2022.01)
(Continued)

(52) U.S. Cl.
CPC .............. *G01J 5/0896* (2013.01); *B81B 7/02* (2013.01); *G01J 3/108* (2013.01);
(Continued)

(58) Field of Classification Search
CPC .. G01N 21/35; G01N 21/552; G01N 21/1702; G01N 21/3405; G01N 2021/3595
See application file for complete search history.

(56) References Cited

U.S. PATENT DOCUMENTS

2009/0244678 A1   10/2009   Hagood, IV et al.
2019/0259108 A1*  8/2019    Bongartz ........... G06Q 10/0639

FOREIGN PATENT DOCUMENTS

WO   WO 2007/070540 A2   6/2007
WO   WO 2017/060264 A2   4/2017
WO   WO-2017060264 A2 *  4/2017   .............. G01J 3/108

OTHER PUBLICATIONS

International Search Report in PCT/EP2019/074516, dated Dec. 20, 2019 (English Translation).
(Continued)

*Primary Examiner* — David E Smith
*Assistant Examiner* — Hsien C Tsai
(74) *Attorney, Agent, or Firm* — Knobbe Martens Olson & Bear LLP

(57) ABSTRACT

The invention relates to a modulatable infrared emitter comprising a MEMS heating element and an actuator, wherein the actuator triggers shape and/or structure changes of the MEMS heating element. Said change in shape and/or structure of the MEMS heating element may vary the ratio of the emitting area to the total area, thereby producing a change in intensity of the emitted infrared beam. The invention further relates to a manufacturing method for the infrared emitter, a method for modulated emission of infrared radiation using the infrared emitter, and preferred uses of
(Continued)

the infrared emitter. In further preferred aspects the invention relates to a system comprising the infrared emitter and a control device for regulating the actuator.

19 Claims, 3 Drawing Sheets

(51) Int. Cl.
    *G01J 3/10*     (2006.01)
    *G01N 21/3504*     (2014.01)
    *B81B 7/02*     (2006.01)

(52) U.S. Cl.
    CPC ..... *G01N 21/1702* (2013.01); *G01N 21/3504* (2013.01); *B81B 2201/032* (2013.01); *B81B 2201/033* (2013.01); *H05B 2203/032* (2013.01)

(56) References Cited

OTHER PUBLICATIONS

Puscasu, Irina, et al., "Photonic Crystals Enable Infrared Gas Sensors," Proceedings of SPIE vol. 5515, Jan. 1, 2004, pp. 58-66.

\* cited by examiner

MODELING THE EMISSION INTENSITY OF AN IR EMITTER BY VARYING THE EMISSION SURFACE

The invention relates to a modulatable infrared emitter comprising a MEMS heating element and an actuator, wherein the actuator triggers shape and/or structure changes of the MEMS heating element. Said change in shape and/or structure of the MEMS heating element can vary the ratio of the emitting area to the total area, thereby producing a change in intensity of the emitted infrared beam. The invention further relates to a manufacturing method for the infrared emitter, a method for modulated emission of infrared radiation using the infrared emitter, and preferred uses of the infrared emitter. In further aspects the invention relates to a system comprising the infrared emitter and a control device for regulating the actuator.

BACKGROUND AND STATE OF THE ART

Modulatable infrared emitters (IR emitters) are relevant for a variety of spectroscopy applications. In particular, the spectroscopy of gases is often carried out with the aid of infrared radiation, which at certain frequencies triggers vibrations of the molecules detectable as absorption lines in the spectrum.

Photoacoustic spectroscopy is often used, employing intensity-modulated infrared radiation with frequencies in the absorption spectrum of a molecule to be detected in a gas. If the molecule is present in the beam path, modulated absorption takes place, leading to heating and cooling processes whose time scales reflect the modulation frequency of the radiation. The heating and cooling processes lead to expansions and contractions of the gas, causing acoustic waves at the modulation frequency. Said acoustic waves can subsequently be measured by acoustic detectors (microphones) or flow sensors.

Photoacoustic spectroscopy allows the detection of very fine concentrations of gases and has a variety of applications. An example is the detection of $CO_2$, which takes an important role in research and air conditioning technology. The concentration of exhaust gases in the air may for instance also be measured in such a way. Military applications in which smallest concentrations of toxic gas can be detected may also be relevant.

Various emitters are used as radiation sources for the applications mentioned, with different advantages and disadvantages. For example, narrowband laser sources in the infrared range can be used. These allow the use of high radiation intensities and can be high-frequency modulated with standard components, e.g. for photoacoustic spectroscopy. However, due to the narrow spectrum of the laser, only molecules with a matching absorption spectrum are detectable. Lasers are moreover relatively expensive. If a detect of a number of different molecules is desired, a corresponding number of lasers must be used.

Thermal, broadband emitters are also known. These emitters have the advantage of a wide spectrum and often low cost. However, the modulation frequency of these emitters is limited, and direct modulation by varying the current supply is slow due to thermal time constants and significantly degrades device life. Slow modulation often results in a measurement with a poor signal-to-noise ratio due to the inherent noise of the detection components. External modulation through the use of spinning chopper wheels is faster, but the setup is costly and not as compact and robust as would be desirable for many applications. Also, modulation bandwidths are limited and varying the rotation speed of the chopper is cumbersome due to inertias.

Today, microsystems technology is used in many fields of application for the manufacture of compact, mechanical-electronic devices. The microsystems (microelectromechanical systems, MEMS for short) that can be manufactured in this way are very compact (micrometer range) with excellent functionality and ever lower manufacturing costs. For example, DE 10 2017 206 183 A1 describes fast and compact comb drives as MEMS actuators.

From US 2009/0244678 A1, for example, displays are known which are constructed from mechanical light modulators, wherein MEMS-based shutter units can form the pixels of an image.

The use of MEMS technology to modulate thermally generated infrared radiation is only known in isolated cases in the prior art.

WO 2017/060264 A2 discloses an infrared emitter, wherein the heating element is formed by a photonic crystal with a periodic modulation of the refractive index. In one embodiment, WO 2017/060264 A2 proposes to modulate the emission of the IR emitter. For this purpose, one or more Bragg mirrors are positioned laterally to the heating element. By means of MEMS comb drives, the Bragg mirrors can be moved to modulate the emissivity of the heating element due to the interaction of the resonance of the Bragg mirrors and the photonic crystal. In the case, the adjustment of the emission characteristics is limited by the choice of the geometry of the photonic crystal and is restricted to narrowband spectra. Also, the modulation requires precise tuning of the resonance of the Bragg mirrors and the photonic crystal.

WO 2007/070540 A2 describes a wavelength selective element comprising an array of electrically conductive surface elements disposed over an electrically conductive layer or base plate by an electrically insulating interlayer. WO 2007/070540 A2 proposes to combine the wavelength selective element with an IR light source to obtain a tunable narrow band IR emitter by resonant coupling.

Puscasu et al. proposes infrared emitters or detectors that combine a photonic crystal consisting of an array of holes etched into a dielectric with a periodically perforated metallic thin sheet (I. Puscasu: "Photonic crystals enable infrared gas sensors," PROCEEDINGS OF SPIE, Vol. 5515, pp. 58-661. January 2004). Resonant coupling of the elements should result in high optical absorption or emission levels in a narrow wavelength range, with modulation occurring electrically.

The approaches of WO 2007/070540 A2 and Puscasu et al. are also based on modulation of an IR emitter on the basis of resonant coupling, which on the one hand is constructively complex and requires precise tuning, and on the other hand only permits modulation of narrowband spectra.

In light of the prior art, there is thus a need for improvement to provide a high-frequency and variably modulatable IR emitter that can, in particular, emit a broad spectrum of infrared radiation in a modulated manner while being characterized by a simple, low-cost, and compact design.

OBJECTIVE OF THE INVENTION

It is an objective of the invention to provide a modulatable infrared emitter as well as a method for generating modulated infrared radiation without the disadvantages of the prior art. In particular, it was an objective of the invention to provide a high-frequency and variably modulatable infrared emitter which can emit a broad spectrum of infrared radiation in a modulated manner and at the same time is characterized by a simple, low-cost compact design.

SUMMARY OF THE INVENTION

The objective is solved by the features of the independent claims. Advantageous embodiments of the invention are described in the dependent claims.

In one aspect, the invention relates to a modulatable infrared emitter comprising.

a heating element and an actuator wherein the heating element is a MEMS heating element comprising heatable regions for emitting infrared radiation in an emission direction, the projection of the heatable regions in the emission direction forming an emission area and the area spanned by the MEMS heating element forming a total area, and the actuator is configured to change the shape and/or structure of the MEMS heating element between a first state and a second state, such that the ratio of the emission area to the total area of the MEMS heating element is smaller by at least a factor of 2 in the first state than in the second state. Preferably, the emission is substantially perpendicular to the total area of the MEMS heating element.

By changing the shape and/or structure of the MEMS heating element, the ratio of the emission area to the total area may be varied. Said ratio may be varied between two extreme points represented by the first state of the heating element (ratio minimum) and the second state of heating element (ratio maximum). For this purpose, the emission area and/or the total area can be changed. The aim is to generate an intensity change of the emitted infrared beam that is concurrent to the variation of said ratio. In contrast to known intensity modulations in infrared emitters by variation of the current supply, the modulation according to the invention is not limited by thermal time constants. Due to the particular suitability of the device for use with MEMS actuators, modulation frequencies of well over 100 Hz can be achieved. Such modulation frequencies are particularly advantageous for photoacoustic spectroscopy. However, the modulatable infrared emitter is also suitable for any other application where fast and reliable modulation of infrared radiation is required.

Primarily, the modulatable infrared emitter is a device that emits electromagnetic radiation. This radiation preferably exhibits a wavelength range in the infrared (IR) region, particularly between about 700 nanometers (nm) and 1 millimeter (mm) wavelength. The corresponding frequency of the emitted radiation may be in the range between about 300 gigahertz (GHz) to 400 terrahertz (THz). The spectrum may just as preferably be represented in terms of the wavenumber m−1 or cm$^{-1}$, as it is common in the field of spectroscopy. A person skilled in the art knows how to convert to the units. The term emitter preferably refers to the device comprising the radiation source, which is represented by the MEMS heating element, wherein by changing the shape and/or structure of the MEMS heating element, the ratio of the emission area to the total area of the MEMS heating element can be varied.

In particular, the spectrum is selected to correspond to the preferred field of application of the emitter, namely infrared spectroscopy and especially photoacoustic spectroscopy. In particular, the vibrational excitation of the gas molecules to be analyzed and/or detected is preferred, which correspond to a preferred spectral range depending on the gas molecules. For example, a spectral range of the IR emitter encompassing a wavelength of about 2.4 micrometers (μm) is suitable for the excitation of $CO_2$ molecules. Particularly preferred wavelength ranges of infrared radiation are 700 nm to 10 μm, preferably 1 to 5 μm, especially preferably 2 μm to 3 μm.

The radiation can be emitted isotropically, i.e. uniformly in all spatial directions starting from the emitter. In this case the direction of emission can be determined e.g. on the basis of structural features of the emitter in said direction. Uniform in this context means preferably with equal intensity of the radiation. Intensity is in particular defined as area power density and preferably has the unit watts per square meter or abbreviated W/m$^2$. However, as opposed to an isotropic emission of the radiation, it is preferred that the radiation is bundled in the form of a beam oriented along a preferred direction of emission in the form of a degree. Since the radiation of an emitter, especially without additional components, typically diverges and can preferably be described with respect to the emitting surface, e.g., by Lamberts law, additional components such as lenses can be integrated in the emitter or attached externally to provide for bundling or collimation of the beam. A person skilled in the art knows how to shape the emission profile of the radiation source by designing the radiation source as well as by using additional components to result in a desired beam profile or desired emission direction. Preferably, the modulatable IR emitter may comprise only the actual radiation source without additional lenses as well as a system comprising radiation source and at least one lens for collimation of the beam. In the further course, the term beam shall describe the preferably bundled part of the radiation along the preferred emission direction of the emitter, which is emitted by the emitter, wherein in particular the portions of greatest intensity along said direction define the beam.

The emitter is modulatable, which means that the intensity of the emitted radiation, preferably the intensity of the beam can be changed in a controllable manner over time. The modulation shall preferably cause a temporal change of the intensity as a measurable quantity. This means, for example, that there is a difference in intensity over time between the weakest intensity measured within the measurement period and the strongest intensity measured within the same period that is greater than the sensitivity of an instrument typically used for the radiation spectrum and application to measure or determine intensity. Preferably, the difference is significantly greater than a factor of 2 between the strongest and weakest adjustable intensities. A modulatable infrared emitter has a variety of applications. In terms of relevant applications infrared spectroscopy and especially photoacoustic spectroscopy are to be mentioned.

A thermal emitter in the form of a MEMS heating element is provided to generate the infrared radiation. A MEMS heating element is preferably understood to be a heating element with dimensions of the order of micrometers (μm). Here, the heating element comprises a heatable layer of a conductive material that produces joule heat when an electric current flows through the material. The heat produced preferably exhibits a dependence on the ohmic resistance of the element and the square of the current or the square of the applied voltage and the inverse ohmic resistance, depending on whether a current or voltage source is used. In a state of equilibrium, the heat produced is equal to the heat losses due to thermal conduction, convection and thermal radiation (synonymous: infrared radiation) emitted at the external interfaces of the heatable layer through which the current flows. As is known to the person skilled in the art, the heat produced causes i.a. thermal radiation, in particular by thermal movement of particles, which results, for example, in an acceleration of charge carriers and/or oscillating dipole moments. Thus, infrared radiation can be specifically generated by a current-carrying heatable layer. The heatable layer is preferably made of metal, for example tungsten or platinum. By applying a suitable voltage, the resulting current flow leads to the generation of joule heat and ultimately infrared radiation. The radiation spectrum can preferably be described approximately by Planck's radiation law, wherein the person skilled in the art is aware of the differences between an actual heatable layer and a black body, for example, the emissivity or the actual deviation from a thermal equilibrium of the body. Despite these deviations, the generated spectrum and its intensity is essentially described by the temperature and the radiating area according to Planck's radiation law. Thus, a person skilled in the art can achieve a preferred spectrum with a preferred intensity distribution through specific design of the MEMS heating element. For this purpose, in addition to the material and geometric design of the heating element, the electrical energy provided, a surface treatment of the radiating interface, and the magnitude of the heat losses of the heating element in addition to the thermal radiation are preferably decisive. The magnitude of these heat losses is determined, for example, by the thermal conductivity between the heating element and the adjacent materials and/or fluids as well as their heat capacity and the size of the interface(s).

The structured MEMS heating element spans a two-dimensional plane, the total area. This is preferably a surface of the MEMS heating element oriented in the emission direction. Oriented in the emission direction refers to the fact that a normal of the surface points is oriented in the emission direction. In other words, the emission direction is preferably substantially perpendicular to the total area of the MEMS heating element. For example, the emission direction may include an angle of 90°±10°, preferably 90°±5°, more preferably 90°, with the total area of the MEMS heating element. By spanning it is preferably meant that the outer perimeters of the surface of the MEMS heating element also represent the perimeters of the total area. The total area is preferably a contiguous area defined by these perimeters. The outer perimeters of the surface of the MEMS heating element oriented in the emission direction are in turn defined by the outer perimeters of the functional regions of the heating element, which in turn are formed, for example, by the (non-)heatable regions and/or their projection in the emission direction. Preferably, the total area can also be extended outwardly by a frame structure in which the heatable regions are movably supported. The projection of the heatable regions in the direction of emission or onto the total area is called the emission area. The emission area can be a continuous area or can be formed from several partial areas, in which case there are preferably non-heatable regions or projections thereof between the emission areas. A non-heatable region is preferably determined by the fact that the region lies between at least two heatable region and is itself not a heatable region and lies in the plane of the total area or has a projection therein. A non-heatable region is thus part of the total area, but not part of the emission area. There may also be a frame structure, so that the projections of the non-heatable regions are all those areas within the frame structure which are not emission areas.

In the following, the term "projection of non-heatable regions" shall preferably be used instead of "non-heatable regions". This projection can be a continuous area and/or formed by several partial areas. Accordingly, the total area is formed by the emission area(s) and the projection(s) of the non-heatable regions. The modulation of the IR emission intensity over the total area is essentially mapped by the infrared beam. In particular, this means that a modulation of the intensity of the IR radiation over the total area at one point in time essentially corresponds to a modulation of the intensity of the IR beam at a later point in time.

If the IR beam is transformed into an image (e.g. by focusing) a modulation of the imaged intensity of the IR beam essentially corresponds to or is proportional to the modulation of the intensity over the total area of the heating element. For example, if the total area is doubled while the emission area remains the same, the average intensity of the IR beam following the total area is halved because a constant emission energy is emitted over an area twice as large. Even with subsequent focusing of the IR beam, the change of intensity change propagates in the emission pattern, so that there is essentially a halving of intensity in the further optical mappings of the IR beam.

To modulate the intensity of the infrared radiation, the shape and/or structure of the heating element can be changed between a first state of the heating element and a second state of the heating element, so that the emission area or the total area changes. For this purpose, the size of the emission area and/or total area or, in particular, their ratio may be varied. Preferably, the ratio of the emission area to the total area is expressed by the quotient between these two quantities.

In one embodiment, for example, the emission area can be increased between a first state and a second state while maintaining the same total area. To this end the total area of the heatable regions may be increased. Since the total area remains the same in said example, this means that the projection of the non-heatable regions, which together with the emission area form the total area, is reduced during the transition from the first to the second state. In this regard, it may be preferred that the total area comprises substantially projections of non-heatable regions in the first state and substantially emission area(s) in another state. In this exemplary embodiment, the total energy of radiation emitted over the total area per unit time is increased and, in the same proportion, the intensity of IR radiation is increased over the (constant) total area.

It may be equally preferred, in another embodiment, that between a first state and a second state, the total area is reduced while the emission area remains the same. For this purpose, the area of the heatable regions remains the same, while the area of the projection of the non-heatable regions is reduced.

In this embodiment, the energy of the IR radiation emitted over the total area per unit time remains unchanged. The intensity of the IR radiation emitted over the total area is thus increased by emitting a constant total energy over a decreased total area.

If the MEMS heating element is characterized by several heatable regions, for example in strip form, then the emitted beam of the IR emitter is characterized by the combined partial beams of the individual emission areas within the overall area and their intensity. The exact geometric radiation behavior of the individual emission areas is thereby preferably dependent, among other things, on the overall design of the IR emitter, for example, on the geometric design of the heatable regions, the positioning of a lens for collimation of the beam, etc.

It is preferred that the heatable regions are electrically contacted with each other, thus having a common contact to an electrical energy source.

The MEMS heating element is preferably at least partially free-standing and allows, e.g., thermal strains within the IR emitter due to strong temperature changes. Partially free-standing means that it is at least partially non-positively and/or positively connected to other elements of the emitter at the interfaces and therefore exhibits a degree of freedom of movement in a direction substantially perpendicular to the interface.

Terms such as substantially, approximately, about, etc. preferably designate a tolerance range of less than ±40%, preferably less than ±20%, particularly preferably less than ±10%, even more preferably less than ±5%, and especially less than ±1%. Similar preferably designates sizes that are approximately equal. Partially preferably designates at least 5%, more preferably at least 10%, and more preferably at least 20%, in some cases at least 40%. Terms such as substantially preferably always also include the exact value.

The actuator is configured to change the shape and/or structure of the MEMS heating element between a first state and a second state, such that the ratio of the emission area to the total area of the MEMS heating element is smaller by at least a factor of 2 in the first state than in the second state. In particular, an actuator converts an electrical control signal into a movement. This may be a MEMS actuator, which is for example an electrostatic actuator. The MEMS actuator can be directly connected to the MEMS heating element. The MEMS heating element preferably comprises elements that are movable in at least one degree of freedom to realize the shape and/or structure change. A shape and/or structure change preferably causes a change in the size of the emission area and/or the total area of the MEMS heating element, and may further preferably cause a change in the size of the entire heating element and/or surface(s) thereof.

The movable elements must be mounted in such a way that a desired movement can be performed repeatedly in large numbers and results in the desired area change. To this end a movably mounted element may be connected to the rigid elements of the heating element and/or the remaining components of the emitter, for example, via a linear guide. A linear guide preferably allows linear movement along one direction and prevents movement in another direction or restricts the degree of freedom of movement in the other directions. At the same time, a linear guide preferably allows movement along this direction with as little friction and maintenance as possible, for example by means of rolling elements and/or plain bearings. It may also be preferred to use radial bearings to allow rotational movement of movable elements. In particular, the MEMS heating element may comprise a spring structure, wherein the movable elements are connected to each other in a spring-like manner and a stretching or compression of the spring structure of the MEMS heating element can be achieved.

The movable elements preferably comprise the heatable regions or are realized by the heatable regions. The at least one actuator is in turn coupled to the movable elements in such a way that the desired movement can be executed.

Actuator and movable elements of the heating element can preferably be directly connected to each other. It may even be preferred that both the elements and the actuator comprise the same substrate and/or are made of the same substrate. There may be not only a mechanical, but also a thermal and/or electrical coupling to the actuator. Through thermal coupling, a desired non-radiative heat loss of the heating element can be achieved, which influences the radiative and/or modulation properties of the heating element in a desired manner. Electrical coupling may achieve electrical contacting of the heatable layer of conductive material of the heating element.

The actuator is preferably configured for a shape and/or structure change from the first to the second state with a desired speed and repetition rate and can be controlled by an electrical signal according to the performance requirements.

The structure and/or shape change produces an intensity change over the total area as described, which results in an intensity change of the IR radiation emitted by the MEMS heating element in the emission direction. Herein, the generation of modulated infrared radiation is the actual object to be achieved by the described modulatable IR emitter. It is preferred that the emitted infrared radiation in the first state is significantly lower than in a second state. In particular, it is preferred that said intensity is lower by at least a factor of 2. The ratio between the maximum and minimum intensity of the emitted IR radiation, which can be adjusted by the emitter, can preferably be also referred to as the extinction ratio and is preferably, together with the modulation frequency, an expression of the achievable modulation properties of the emitter. It may be determined directly from the quotient between maximum intensity and minimum intensity, and is preferably specified directly by said quotient. However, it may also be preferred that the ratio is expressed in the logarithmic scale decibel (dB), as is common in communications engineering, for example. By the described construction of the emitter, the emitter can be kept particularly compact and simple. Herein, a high modulation frequency and bandwidth can be achieved, since the movable elements exhibit only marginal inertias due to their small mass and no large forces are required for movement. Also, such a structure is particularly easy and inexpensive to be produced through common manufacturing steps of MEMS and/or semiconductor technology. Preferably, the IR emitter can thereby be at least partially integrated, fabricated in one fabrication step and/or fabricated from a substrate. In particular, in some embodiments of the invention, a particularly high modulation depth (extinction ratio) can thereby be achieved.

The maximum modulation frequencies achievable at the desired modulation depths should preferably be at least 1 kilo Hertz (kHz), particularly preferably at least 10 kHz, more preferably at least 20 kHz, particularly preferably at least 30 kHz, and especially at least 100 kHz. It is particularly preferred to achieve modulation frequencies in the range of audible sound and/or ultrasound for an application in photoacoustic spectroscopy. The modulation bandwidth over which the desired modulation depth is achieved preferably concerns the entire frequency range from 0 Hz to the maximum modulation frequency.

The desired modulation can preferably find expression in a corresponding temporal course of the emitted radiation intensity. To determine the feasibility of such a desired temporal intensity course, the modulation depth and the bandwidth over which said modulation depth is essentially achievable are of particular importance. Moreover, the resolution of an electronic control of the IR emitter is preferably relevant for feasibility. For example, it may be of importance which different intensity levels between minimum and maximum intensity can be achieved with which frequency. It is preferred that the IR emitter exhibits an electrical control with which the MEMS heating element and the change in shape and/or structure of the heating element caused by the at least one actuator are controlled.

Such a control can be achieved for a instance by a control device. By means of a control device the desired spectra, intensities and modulations may be adjusted. Control preferably means that electrical control signals are transmitted directly to the actuator and the MEMS heating element, which result in the desired radiation properties. In particular, in the case of the MEMS heating element a specific temperature and/or a specific temporal temperature profile can thus be set. Furthermore, a certain modulation signal can be obtained by the shape and/or structure change triggered by the actuator (possibly in coordination with a temperature course). Typically, said modulation signal is an analog signal generated by a control device. This in turn can preferably receive a suitable, digital, electronic signal, for example from a control computer, which is subsequently translated by the control device into suitable actuation signals The structure of the modulatable infrared emitter will now be described by means of two specific embodiments for illustration purposes, without intending to be limited to the disclosed embodiments. In one embodiment, the IR emitter is preferably accommodated in a housing which comprises a lower support, side parts and a cover element. In the cover element, there is preferably an opening or a region transparent to IR radiation. The cover element may further comprise at least one lens and/or optical filter. Sealing elements may be present between the support, the cover element and the side parts, respectively. These sealing elements are preferably used to reduce thermal exchange of the interior of the emitter, in which the MEMS heating element is present, with the external environment of the IR emitter. Here, the MEMS heating element preferably consists of a spring structure with individual, parallel heatable regions that are resiliently connected to each other. The projections of the heatable regions oriented in the direction of the cover element and in the direction of emission form the emission area, which in turn forms the total area with the intervening non-heatable regions or their projections.

A change in shape and/or structure due to an increase in the size of the MEMS heating element and its total area is achieved by means of two actuators in the form of comb drives placed to the side of the heating element, which are directly coupled to the spring structure of the MEMS heating element. The actuators are in turn each attached to a side part of the housing. The MEMS heating element is preferably free-standing except for the connection to the actuators. By applying a tensile force to both sides of the spring structure, the actuators can be brought into an elongated state in which the area of the projections of the non-heatable regions is maximized while the emission area remains the same, which likewise applies to the emitted IR radiation. Therefore, a maximization of the total area results, so that the ratio of the emission area to the total area of the MEMS heating element and likewise the emitted IR radiation becomes minimal. Moreover, the spring structure can be brought into a compression by pressure forces on both sides of the actuators, in which the ratio of the constant emission area to the total area is maximized. Thus, it can be achieved that the ratio of the emission area to the total area of the MEMS heating element in a first state is at least a factor of 2 lower than in the second state. The emitted IR radiation is thereby preferably directly proportional to the area ratio. Such an IR emitter exhibits a particularly high modulation frequency and a particularly precise controllability of the intensity of the emitted IR radiation.

In another embodiment of the modulatable IR emitter, the MEMS heating element comprises a lamellar structure with rotatable lamellae, similar to a venetian blind, which are rotatably mounted in a frame structure, which define the outer boundaries of the total area. The lamellas form the heatable regions. If the lamellas are oriented in the direction of emission, the emission area and the total area essentially coincide. The ratio of the emission area to the total area of the MEMS heating element and the intensity in the emission direction is maximal. Said condition corresponds to the second state. If the individual fins are rotated 90° with respect to the emission direction by at least one actuator so that the heatable regions are substantially equally no longer facing that direction, the emission area becomes minimal while the total area remains substantially the same and is now substantially identical to the projection of the non-heatable regions. The ratio of the emission area to the total area of the MEMS heating element is minimal, as is the intensity in the emission direction (first state). Thereby it is also implemented that the ratio of the emission area to the total area of the MEMS heating element in the first state is lower than in the second state by at least a factor of 2.

It may be preferred that the lamellae do not exhibit isotropic emission of the IR radiation, but that the emission is preferably greatest in the direction of the surface normal vectors of the heatable regions (front surfaces). The sides of the lamellae aligned in the direction of emission in the second state thus also emit less IR radiation in relation to their area than the front surfaces aligned in the direction of emission in the first state. As a result, the intensity at the transition from the second to the first state decreases disproportionately compared to the change in the area ratio, and a particularly high modulation depth can be achieved in this embodiment.

Such an IR emitter illustrated by the above examples has preferred characteristics, it allows for rapid modulation and the modulation depth is suitable for many applications. The IR emitter is compact, robust and durable. The bandwidth of the modulation is also greatly improved over modulation techniques known in the prior art.

In a preferred embodiment of the invention, the intensity of the infrared radiation emitted by the MEMS heating element in the direction of emission is lower in the first state than in the second state by a factor of 2, preferably 4, more preferably 6. The intensity is preferably to be understood as the average intensity of the infrared radiation over the total area of the MEMS heating element and is thus preferably formed from the radiation energy per total area and unit time. The modulation of the intensity is achieved, as described above, in particular by the fact that in a first state the ratio of the emission area to the total area is lower by at least a factor of 2, preferably 4 or 6, than in a second state. In this case, depending on the embodiment, the intensity can change by exactly the ratio factor or by a larger factor if, for example, the intensity of the IR radiation emitted per unit area of the emission surface changes. This is the case, for example, if the MEMS heating element has a lamellar structure and the heatable regions are rotated out of the emission direction during the transition from the second to the first state. As a consequence the modulatable IR emitter allows a particularly effective modulation, since the modulation depth corresponds at least to the change of the area ratio.

The ratio of the average intensities between the second and first state is preferably also referred to as an extinction ratio. It is particularly preferred that an extinction ratio of at least 2 is achievable. This ratio is preferably the direct quotient between the maximum and minimum intensities. However, it may also be preferred that higher extinction ratios of, for example, at least 3, 4, 5, 6, 7, 8, 9, 10, 15, 20, 25, 30, 40, 50, 100, 200, 300, 400, 500 or 1000 are possible. The extinction ratio may likewise be expressed in dB, with extinction ratios of at least 3 dB, at least 10 dB, at least 20 dB, at least 30 dB, or at least 40 dB being preferred. The preferred extinction ratios allow for the desired applications, e.g. in photoacoustic spectroscopy, to be realized particularly well.

In a further preferred embodiment of the invention, the MEMS heating element comprises a spring structure and the actuator is a linear actuator which is configured for compression and/or extension of the spring structure. The embodiment, partially described above, is characterized by a particularly compact and easy-to-manufacture structure, which allows for particularly high modulation frequencies. A linear actuator is preferably an actuator in which the driving principle results directly in a linear movement of a rotor in one dimension. This allows compressive or tensile forces to be applied to the spring structure for compression or extension. In this regard, it may be preferred to firmly connect the spring structure to the housing of the IR emitter at one end and directly to the rotor of the actuator at the other end. Likewise, as described above, it may be preferred to connect the spring structure to the rotors of two linear actuators at both ends. In this way, a large change between emission area and total area can be achieved even with small movements of the respective actuator. Thus, surprisingly high modulation depths with simultaneously high modulation frequencies are possible. The spring structure is preferably realized by elastic connections between heatable regions by a spring-like structure. In this way, a particularly simple and effective structure can be provided.

In a further preferred embodiment, the MEMS heating element comprises a lamellar structure with rotatable lamellae and the actuator is configured to rotate the lamellae. The embodiment has also been described above. In this case, the lamellae are rotatably mounted in a frame structure. The lamellae can each be controlled via their own actuator, e.g. via an electrostatic (capacitive) or electromagnetic actuator. Such actuators are particularly simple and compact to implement, energy-efficient, and permit particularly fast rotation of the blades, and thus a particularly high modulation frequency. It is also possible that at least one actuator in the form of an electric motor is used. Such an actuator is particularly well suited for rotary movements and permits particularly precise control of the lamellas, in which positions between a rotation of 0° and 90° can also be specifically controlled with respect to the emission direction. Such an actuator can also be used to rotate several lamellas simultaneously, for example by means of a gear wheel or a belt.

In a preferred embodiment of the invention, the MEMS heating element comprises an interleaving structure and the actuator is a linear actuator configured to vary the interleave (interlacing, entanglement). A variation of the interleave herein preferably describes a variation of the total area and/or the emission area by a change of the distance between the individual, preferably T-shaped elements of the structure. The basic principle is preferably similar to a spring structure, the interleaving structure can be compressed (shortened) by the actuators, corresponding to a second state, or pulled apart (stretched), corresponding to a first state. The interleaving structure is thereby preferably formed by several T-pieces, which are arranged in alternating orientation upwards, with the crossbar in the direction of emission, and downwards, respectively, and thus fit well into each other in a compressed, second state for the smallest possible total area. The heatable regions are preferably formed by the upper T-pieces, the crossbars of which preferably substantially coincide with the emission area. The individual T-pieces are preferably connected by an elastic structure, which is structured, for example, in a spring-like manner. Likewise, the T-pieces can preferably be mounted on a rail in a suitably movable manner. The T-pieces themselves can also preferably be rotors of an electrostatic actuator.

In a preferred embodiment, the infrared emitter comprises a housing in which the MEMS heating element and the actuator are installed.

Preferably, the housing may be based on the dimensions and shapes of the installed elements, it may be equally preferred that the housing is significantly larger than the installed elements to improve handling of the emitter and create a robust device. For example, the MEMS heating element and actuator may have dimensions in the (sub-) micron range, with the housing having dimensions in the centimeter range.

It is possible, as already described above, that the actuator within the housing is directly coupled to the MEMS heating element. Also, a possible general structure of the emitter, which exhibits a housing, has already been described in an exemplary embodiment above.

Preferably, the housing exhibits a continuous outer surface and is closed on the inside. In particular, the MEMS heating element is installed inside the housing. This allows the MEMS-heating element to be protected from external influences. In addition, it can be ensured that an emission of IR radiation to the outside occurs only through preferred areas of the cover element that are permeable to IR radiation, while the housing prevents emission in other directions. The actuator can preferably be attached to a side part of the housing.

It is preferred that the MEMS heating element is not thermally isolated from the housing, but rather allows non-radiative heat dissipation from the heating element to the housing so that heat may dissipate from the heating element. For example, a desired balance can be established between the heat generated by the current-carrying, heatable layer of conductive material and the heat dissipated from the heating element to the environment, desired radiation characteristics may be generated, and/or desired modulation characteristics can be achieved.

For example, it may be preferred that the components housing, MEMS heating element and/or actuator are made of the same material and that is sufficient thermal conduction between directly connected components is present.

The housing may preferably comprise a heat sink for its own heat dissipation.

It is desirable that the cover element, is thermally decoupled from the other components, in particular from the rest of the housing. This preferably means that by using at least one suitable material at the connection between the cover element and the rest of the housing or by a suitable design of the connection point (for example small connection area and/or suitable thickness of the connection) it may be ensure that the cover element does not heat up significantly. Heating up is preferably described in relation to a temperature of the cover element when the MEMS heating element is switched off and in thermal equilibrium.

Likewise, it may be preferred that the time constant essential for determining the time course of the approximation of the temperature of the cover element to the housing is sufficiently large. This can, for example, be greater than 1 minute, preferably greater than 10 minutes and in particular greater than one hour.

A suitable material at the connection point preferably covers the entire connection surface.

Suitable materials may in particular be defined by a thermal conductivity of the materials, expressed in watts per meter and kelvin (W/m·K). Preferred thermal conductivities at the connection point are less than 10 W/m·K, particularly preferably less than 1 W/m·K and especially less than 0.1 W/m·K.

Preferably, an oxide layer is introduced at the connection point between the cover element and the rest of the housing to provide the desired thermal decoupling. An oxide layer is especially well suited for providing thermal decoupling in the materials used for the housing. Moreover, they are particularly easy and inexpensive to produce.

In order to minimize the direct transfer of heat between the MEMS heating element and housing, in particular the cover element, it may be preferred that the housing is configured for a generation of a vacuum in a space between these components. A vacuum preferably denotes a pressure of less than $30 \times 10^3$ Pascals (Pa), more preferably less than 100 Pa, and more preferably 0.1 Pa or less. Configured means that the housing is designed to be sufficiently pressure tight. It is also preferred that the housing comprises a connection for a vacuum pump or an integrated vacuum pump. However, it is equally preferred that the housing is substantially permanently evacuated during manufacture.

It may also be preferred that the housing and/or especially the cover element is cooled to minimize emission of unmodulated IR radiation in direction of the modulated beam by these components. For example, Peltier elements and/or fluid cooling can be used to this end.

In a further preferred embodiment of the invention, the housing comprises a cover element in which at least one optical filter is additionally installed.

Thus, the optical filter is preferably integrated into the housing and is present on its outer surface, which is formed by the cover element of the housing. The optical filter can essentially form the cover element or be enclosed by said cover element.

Depending on the use of the IR emitter, e.g. in various spectroscopy methods, either the entire broad frequency spectrum of the thermal radiation source may be used or narrower spectra are desired. To select a desired spectrum that is significantly different from the emitted spectrum of the MEMS heating element, frequency filters may preferably be used. Advantageously, these may be integrated into the cover element.

The filters used can advantageously have different filter characteristics, e.g. band-pass filters, short-pass filters, long-pass filters, notch filters and any combination of these filters that lead to the desired spectral influences may be used. The frequencies or frequency ranges in which the filters act can be chosen flexibly depending on the application.

For example, a filter wheel can be used as a filter, on which filters with different filter properties are installed. The desired filter can be selected mechanically by rotating the filter wheel. Preferably, the filter wheel can be rotated by an electric drive.

The use of a Fabry-Perot filter is also conceivable. Such a filter can be used, for example, to select very narrow spectra. Preferably, the Fabry-Perot interferometer on which the filter is based is tunable, for example by tuning the temperature or by mechanical adjustment. Thus, desired spectra can be flexibly selected from the original beam.

Likewise, suitable thin-film filters can preferably be used. These are particularly easy to manufacture and are very compact. In particular, if the IR emitter is manufactured in an integrated design in a manufacturing process, the production of such a thin-film filter can be easily integrated into the process. This reduces costs.

A flexible combination of thin-film filters or employment of a thin-film filter tunable for example by changing the temperature may be also advantageous.

Filters for other properties of the IR radiation, e.g. polarization, may also be used. Preferably they are part of the cover element.

In a further preferred embodiment of the invention, the MEMS heating element comprises a substrate on which is deposited, at least in part, a heatable layer of a conductive material on which contacts for a current and/or voltage source are present.

The substrate preferably forms the base of the MEMS heating element and can be suitably structured, e.g. for a spring structure. In this context, the substrate may also comprise further components of the IR emitter, such as the actuator and/or housing components, at least in part.

Advantageously, the substrate can be suitably formed by established process steps, in particular from semiconductor and/or microsystem manufacturing. Subsequently, preferably, a heatable layer of a conductive material may be applied to or integrated into the substrate, e.g., by doping and/or coating. The heatable layer preferably comprises the heatable regions of the MEMS heating element. It is preferred that the heatable layer is contacted to a source of electrical energy to establish electrical contact. Primarily, the contacting is to be performed such that the heatable regions are at least partially traversed by electrical current and emit IR radiation in a desired manner.

In a further preferred embodiment of the modulatable infrared emitter, the substrate is selected from a group comprising silicon, monocrystalline silicon, polysilicon, silicon dioxide, silicon carbide, silicon germanium, silicon nitride, nitride, germanium, carbon, gallium arsenide, gallium nitride and/or indium phosphide. These materials are particularly easy and inexpensive to process in semiconductor and/or microsystem manufacturing and are also well suited for mass production. Likewise, these materials are particularly suitable for doping and/or coating in order to achieve the desired electrical, thermal and/or radiation properties in certain regions.

In a further preferred embodiment of the modulatable infrared emitter, the conductive material for forming the heatable layer is selected from the group comprising platinum, tungsten, (doped) tin oxide, monocrystalline silicon, polysilicon, molybdenum, titanium, tantalum, titanium-tungsten alloy, metal silicide, aluminum, graphite and/or copper. On the one hand, these materials exhibit the desired thermal, electrical, mechanical and/or radiation properties, and on the other hand, they are particularly easy and inexpensive to process.

In a preferred embodiment, the actuator is a MEMS actuator, preferably selected from the group comprising electrostatic actuator, piezoelectric actuator, electromagnetic actuator, and/or thermal actuator.

A MEMS actuator is preferably an actuator that is manufactured using standard microsystems technology manufacturing methods and also advantageously exhibits dimensions in the order of µm. Such an actuator is particularly compact, robust and low-maintenance and can be manufactured easily and inexpensively. In particular, a number of parts of the emitter can be MEMS components, i.e., components with the preferred properties mentioned above, and can be manufacturable in one manufacturing step with the MEMS actuator. Desirably, the same substrate can be used in parts for fabrication. This simplifies and cheapens the manufacturing process.

The above actuators are particularly well suited for a large number of fast, periodic movements and have low energy requirements, especially due to their compact design. The range of achievable motion speeds is furthermore particular high due to the compact design, low inertias and the preferred linear motion.

For modulation, it may be desirable to dissipate heat to the largest possible extent from the MEMS heating element through the coupled actuator to the housing. Therefore, it may be preferred that the actuator is substantially or partially made of the housing material.

In a further preferred embodiment of the modulatable infrared emitter, the MEMS actuator is an electrostatic actuator in the form of a comb drive based on a variation of comb overlap and/or comb spacing.

MEMS comb drives are known from the prior art, e.g. from patent application DE 10 2017 206 183 A1. Depending on the embodiment, the comb overlap and/or the comb spacing can be varied.

It has been recognized that such MEMS comb drives due to their dimensions and generatable movements are particularly suitable for a preferred linear motion and compact IR emitter.

In another aspect, the invention relates to a manufacturing method for an infrared emitter as described above, wherein the manufacturing of the MEMS heating element comprises the following steps:
  etching of the substrate;
  deposition of a conductive material;
  optionally patterning the substrate into a MEMS heating element and/or the conductive material into a heatable layer;
  contacting of the conductive material.

For example, one of the preferred aforementioned materials can be used as the substrate. During etching, a blank, for example a wafer, can be formed into the desired basic shape of the MEMS heating element. In a next step, the conductive material for the heatable layer is deposited. In particular, the heatable regions are to be included.

If further structuring of the MEMS heating element, e.g. to form a spring structure and/or of the conductive material, is desired, this can be achieved, for example, by further etching processes. Likewise, additional material can be deposited or doping can be performed by common processes.

For contacting the conductive material, suitable material such as copper, gold and/or platinum can additionally be deposited on the conductive material by common processes. Physical vapor deposition (PVD), chemical vapor deposition (CVD) or electrochemical deposition can preferably be used for this purpose.

In this way, a particularly finely structured MEMS heating element can be produced, which preferably has dimensions in the micrometer range as well as the desired functional properties. Likewise, these manufacturing steps have proven particularly successful and belong to standard process steps in semiconductor processing.

In a further preferred embodiment of the invention, etching and/or patterning is selected from the group comprising dry etching, wet chemical etching and/or plasma etching, in particular reactive ion etching, reactive ion deep etching (Bosch process); and/or the deposition is selected from the group comprising physical vapor deposition (PVD), in particular thermal evaporation, laser beam evaporation, arc evaporation, molecular beam epitaxy, sputtering, chemical vapor deposition (CVD) and/or atomic layer deposition (ALD).

These processes are particularly suitable for the fabrication of fine structures with sizes in the micrometer range. In particular, the Bosch process can produce very fine structures with a high aspect ratio, which are advantageous for a functional, compact, efficient MEMS heating element that is preferably fully integrated into the rest of the emitter structure.

In another aspect, the invention relates to a system comprising
  a modulatable infrared emitter described herein
  a control device
wherein the control device is configured to regulate the actuator to change the shape and/or structure of the MEMS heating element between a first state and a second state, such that the ratio of the emission area to the total area of the MEMS heating element is a factor of 2 less in the first state than in the second state.

The control device preferably enables an input and converts this input into suitable control signals. For example, an input may be a desired spectrum, intensity, and/or modulation frequency. The control device primarily generates appropriate analog electrical signals, which are passed to the actuator and/or the MEMS heating element to generate the desired IR radiation.

However, more complex signals can also serve as input, which specify an exact temporal amplitude curve of the outgoing IR radiation for a desired spectrum. The control device in this case also preferably provides suitable control signals for generating the desired modulated IR radiation.

In particular, the control device is configured for regulation of the actuator to change the shape and/or structure of the MEMS heating element between a first and second state. For this purpose, electrical signals are generated that trigger the required movement of the actuator.

Preferably, the control device comprises a control loop, wherein a feedback mechanism can be used to correct a discrepancy between desired control and actual movement of the actuator and/or heating of the MEMS heating element.

It may be preferred that also the temperature profile of the MEMS heating element for additional slow modulation of the IR radiation can be regulated by the control device.

The control device of the system can be positioned externally or integrated into the IR emitter.

The control device preferably comprises a processor, for example a microprocessor. Other integrated circuits used in digital electronics for control may likewise be used.

The use of such a system comprising a suitable control device can considerably simplify the desired use of the IR emitter. For example, suitable spectroscopy signals can be designed on a PC. Via the input, the desired signals are subsequently transmitted to the control device. The control device in turn generates the drive signals, which produce a corresponding IR signal in high agreement with the theoretical specifications.

A control device, in particular in the form of a controller integrated in the emitter, is very compact and easy to handle. The control device preferably comprises a suitable interface for connection to a computer, for example. It may also be desirable that data can be transferred from the controller to the input device via said interface, such as the current temperature of the heating element or other status information.

In a further preferred embodiment of the system, the control device is configured to regulate the temperature of the heatable regions of the MEMS heating element, preferably in a range between 50° C. and 1000° C.

Such a control device is preferably capable of providing suitable electrical power to the MEMS heating element. In particular, it should allow to adjust the temperature sufficiently precisely and/or to keep the temperature constant. A control mechanism with a feedback loop can be used to this end. To measure the current temperature of the MEMS heating element, for example, at least one temperature sensor can be integrated at a suitable location on the heating element.

Such a control device allows to control the spectrum and/or the intensity of the IR emitter particularly easily and reliably.

In a further preferred embodiment, the control device is configured to regulate the actuator for an oscillatory change of state of the shape and/or structure of the heating element.

Preferably, the change in the shape and/or structure of the MEMS heating element triggered by the actuator is repeated regularly between a first and a second state, so that there is an oscillation between the states and the change exhibits a periodicity. Thereby, at the end of the shape and/or structure change, the starting point of the movement shall preferably be reached again and the movement shall be executed anew in the following period. The repetition frequency preferably defines the resulting modulation frequency.

It is also possible to make a stepless adjustment of the modulation frequency within the electronic resolution and/or bandwidth of the control device and/or the actuator. Thus, the modulation frequency can preferably be varied over time.

Thereby a system is provided through which a modulation frequency of the IR radiation can be set and varied very flexibly and efficiently.

In a further preferred embodiment of the system, the control device is configured to regulate the actuator for an oscillating change of state of the shape and/or structure of the heating element, such that a modulation frequency of the radiant power of the emitted infrared radiation between 10 Hz and 100 kHz is achieved.

To this end, it is particularly preferred that all required components, such as control device, MEMS heating element, actuator, etc., enable the required bandwidth.

The above frequencies have proven to be particularly effective for the preferred applications in the field of spectroscopy. In particular, these frequencies have proven to be especially suitable for use in photoacoustic spectroscopy, as they cover a wide range of acoustic frequencies, the generation of which is the primary focus of this spectroscopy method.

In another aspect, the invention relates to a method for modulated emission of infrared radiation comprising.
providing a modulatable infrared emitter according to any one of the described embodiments;
heating the heatable regions of the MEMS heating element to emit an infrared radiation;
controlling the actuator to change the shape and/or structure of the MEMS heating element between a first state and a second state, such that the ratio of the emission area to the total area of the MEMS heating element is at least by a factor of 2 less in the first state than in the second state.

The average person skilled in the art will recognize that technical features, definitions and advantages of preferred embodiments of the IR emitter and system according to the invention equally apply to the method according to the invention.

In another aspect, the invention relates to the use of a modulatable infrared emitter as described above or a system as described above for photoacoustic spectroscopy and/or infrared spectroscopy.

The described IR emitter may be especially used in infrared spectroscopy. However, a compact, long-life IR emitter that has a broad spectrum and can be modulated is of interest for a variety of applications.

For example, time-resolved measurements can be used to select specific frequency ranges of the IR emitter by using a tunable filter to select different frequencies of the spectrum of the emitter at different times. Modulation can in turn modulate certain frequencies from this and transmit others, so that IR pulses with essentially well-defined frequencies are emitted. Thus, in a time-resolved recording, e.g. of an absorption spectrum, the frequency absorbed in each case can be precisely determined.

The use of a compact, long-life and high-frequency modulatable IR emitter in photoacoustic spectroscopy is particular advantageous. Especially for photoacoustic spectroscopy, many applications are conceivable that do not take place in the laboratory and must function in everyday life. Examples are military applications for the detection of poisonous gas or the detection of (harmful) substances in the ambient air. Due to the high modulation frequencies, better signal-to-noise ratios can be achieved compared to direct modulation of the heating element, and a non-direct modulated emitter is also more durable.

In another aspect, the invention relates to a photoacoustic spectroscope for analyzing gas, comprising.
a modulatable infrared emitter according to any of the foregoing described embodiments
an analysis volume fillable with gas and
an acoustic detector,
wherein the analysis volume is positioned between the infrared emitter and the acoustic detector so that the infrared radiation modulatably emitted by the infrared emitter can be used for photoacoustic spectroscopy of the gas.

The person skilled in the art is familiar with photoacoustic spectroscopy, how the techniques is carried out and which components are used in the method. Due to the compact and long-life IR emitter, which is not known from the prior art, the whole setup can be manufactured in a particularly compact way and suitable for everyday use. Due to the high modulation frequencies, the analysis possibilities are extremely versatile. At the same time, the signal-to-noise ratio can be increased, which is better for an acoustic detector with higher frequencies. A typical 1/f noise can thus be reduced, for example.

DETAILED DESCRIPTION

In the following, the invention will be explained in more detail by means of examples and figures without intending to be limiting.

DETAILED DESCRIPTION OF THE FIGURES

Figure 1:
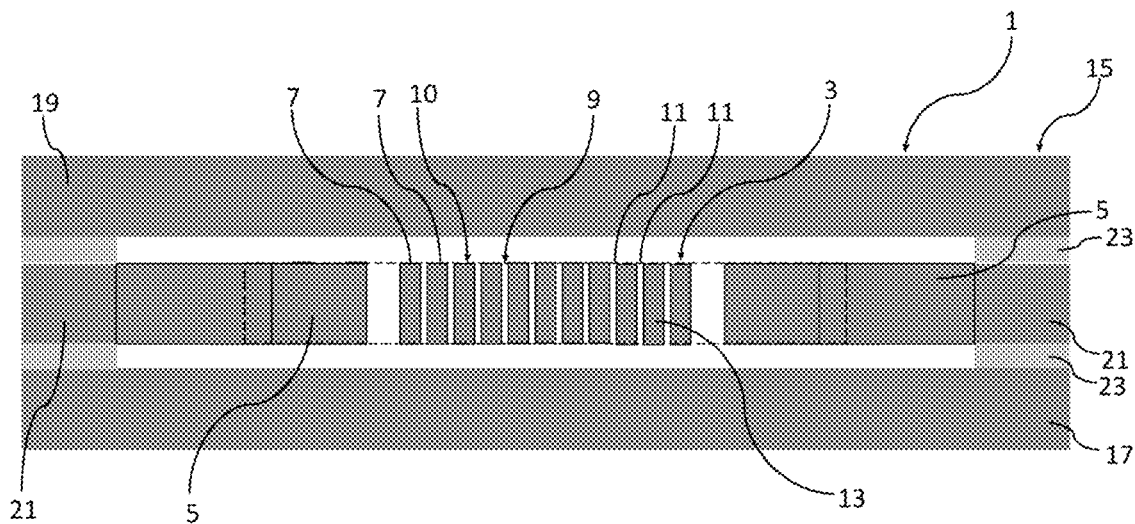
FIG. 1 shows a schematic representation of the IR emitter.

FIG. 1 shows a schematic cross-sectional view of the modulatable infrared emitter 1. The modulatable infrared emitter 1 is accommodated in a housing 15, which consists of a lower support 17, side parts 21 and a cover element 19. Sealing elements 23 may be present between the carrier 17, cover element 19 and side portions 21, respectively. The sealing elements 23 are used to reduce thermal exchange of the interior of the emitter 1, in which the MEMS heating element 3 is present, with the external environment of the IR emitter 1. The MEMS heating element 3 within the housing 15 consists of a spring structure 13 with individual, parallel, heatable regions 7. The projections of the heatable regions oriented in the direction of the cover element 19 and in the emission direction form the emission area 10, which in turn forms the total area 9 with the intervening non-heatable regions 11.

An increase in the total area 9 of the MEMS heating element 3 through a relative movement between the heating element 3 and the heating element 3 is realized by two actuators 5 in the form of comb drives placed laterally of the heating element 3, which is directly coupled to the spring structure 13 of the MEMS heating element 3. The actuators 5 are in turn each attached to a side part 21 of the housing 15. The MEMS heating element 3 is free-standing except for the connection to the actuators 5.

Figure 2:
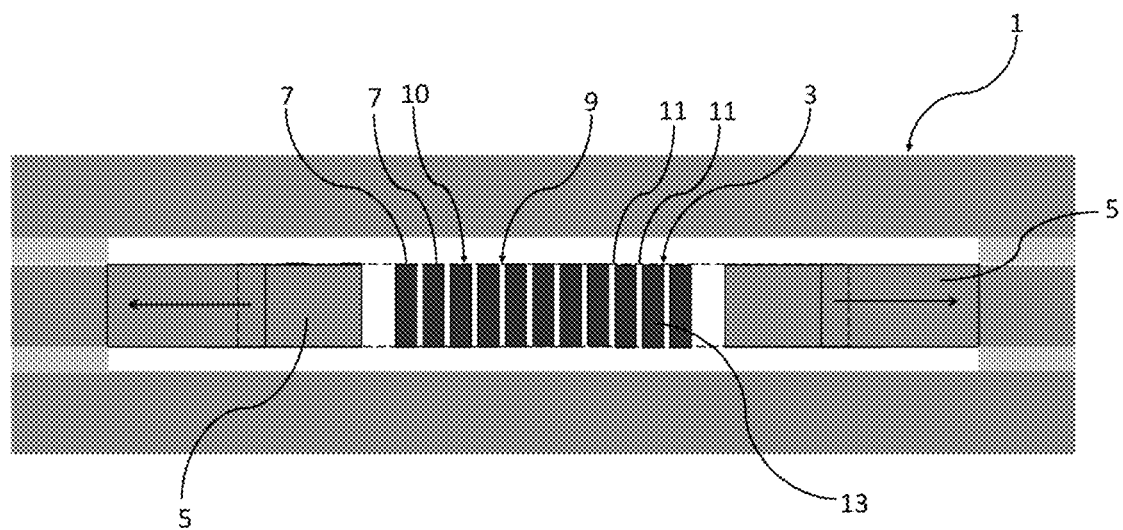
FIG. 2 shows a schematic representation of the IR emitter with a spring structure in a second state.

FIG. 2 shows the modulatable infrared emitter 1 of FIG. 1 in a second state, in which the ratio of the emission area 10 to the total area 9 is at a maximum, since the spring structure 13 is in a compressed state due to the actuators 5, in which the area of the non-heatable regions 11 is minimized and thus also the total area 9, which is composed of the emission area 10 and the non-heatable regions 11. In this embodiment, the emission area 10 remains unchanged. The ratio between emission area 10 and total area 9 is maximal in the second state. This also applies to intensity of the emitted infrared radiation.

Figure 3:
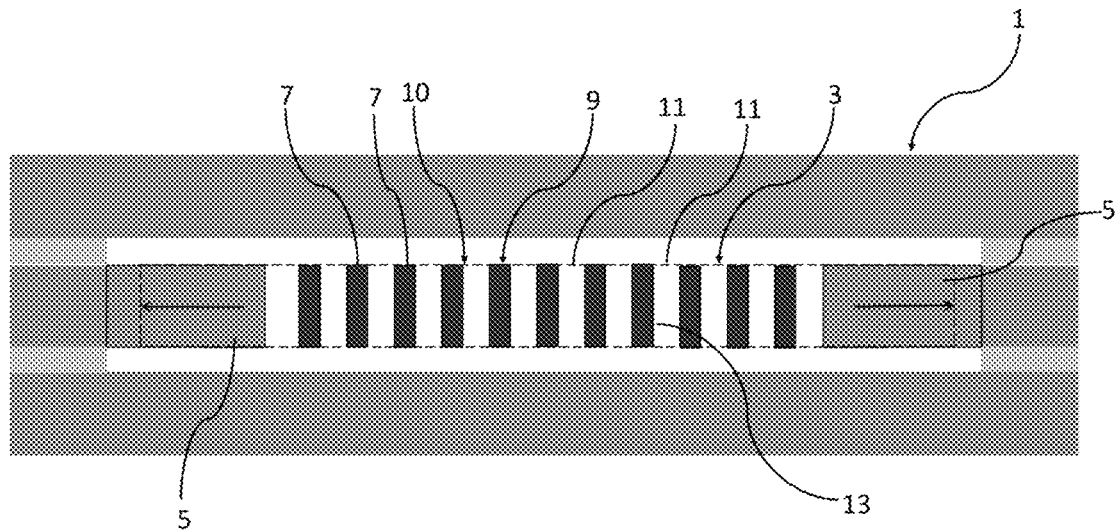
FIG. 3 shows a schematic representation of the IR emitter with a spring structure in a first state.

FIG. 3 shows the modulatable infrared emitter 1 of FIGS. 1 and 2 in a first state in which the emitted radiation has a minimum intensity. Here, the spring structure 13 is brought by the actuators 5 into a stretched state in which the area of the non-heatable regions 11 is maximized while the emission area 10 remains constant. Therefore, there is in turn a maximization of the total area 9, so that the ratio of the emission area 10 to the total area of the MEMS heating element is minimal and lower by at least a factor of 2 than in the second state. The intensity of the emitted infrared radiation is also minimal in this state.

Figure 4:
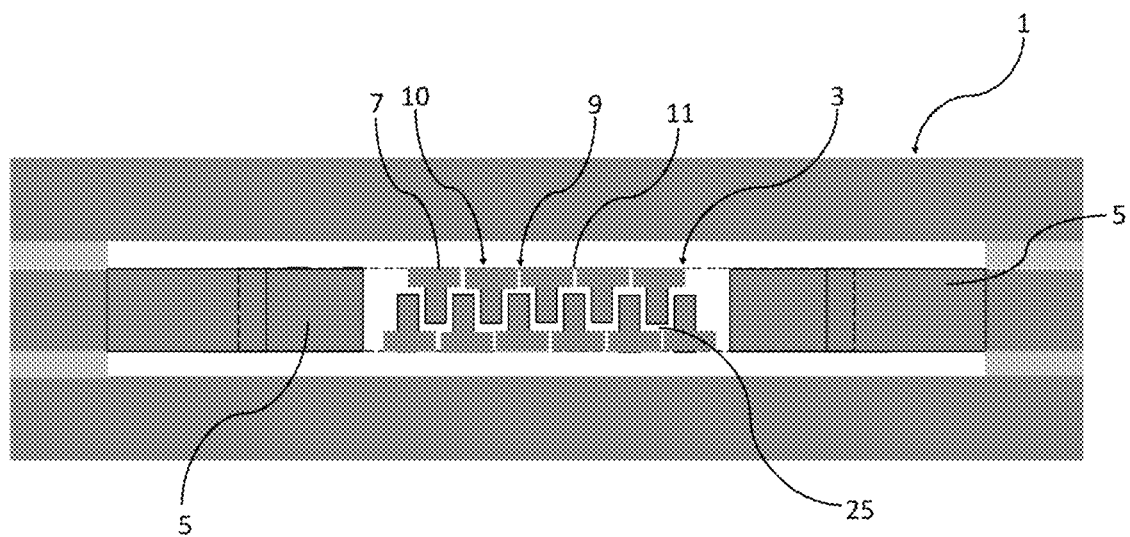
FIG. 4 shows a schematic representation of the IR emitter with an interleaving structure.

FIG. 4 shows an alternative embodiment of the modulatable IR emitter 1, in which the MEMS heating element 3 has an interleaving structure 25 instead of the spring structure. The basic principle here is similar, the interleaving structure 25 can be compressed by the actuators 5, which corresponds to a second state, or pulled apart, which corresponds to a first state. The interleaving structure 25 is formed by a plurality of T-pieces, which are arranged in alternating upward and downward orientations, respectively, and thus fit into each other in a compressed second state for the smallest possible total area 9. The heatable regions 7 can preferably be formed by the upper T-pieces, the crossbars of which preferably substantially coincide with the emission area 10. The individual T-pieces of the structure can preferably be interconnected by an elastic structure.

Figure 5:
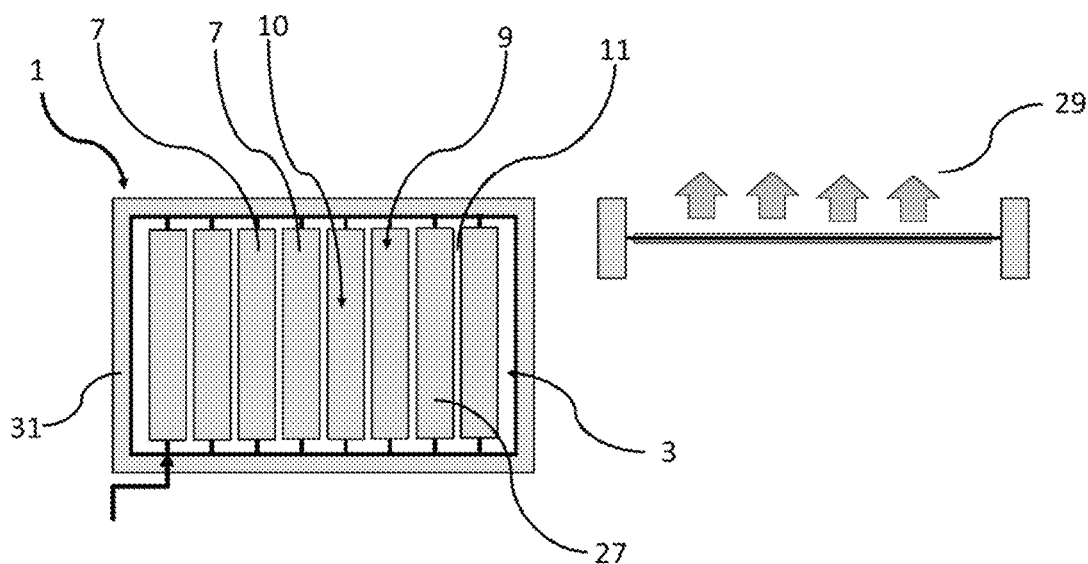
FIG. 5 shows a schematic representation of the IR emitter with a lamellar structure in a second state.

FIG. 5 shows a further embodiment of the modulatable IR emitter 1, wherein the MEMS heating element 3 has a lamellar structure 27 with rotatable lamellae. The fins form the heatable regions 7 and are rotatably mounted in a frame structure 31. Shown is a second state in which heatable regions 7, emission area 10 and total area 9 substantially coincide. The ratio of the emission area 10 to the total area of the MEMS heating element and the intensity in the emission direction 29 is maximum.

Figure 6:
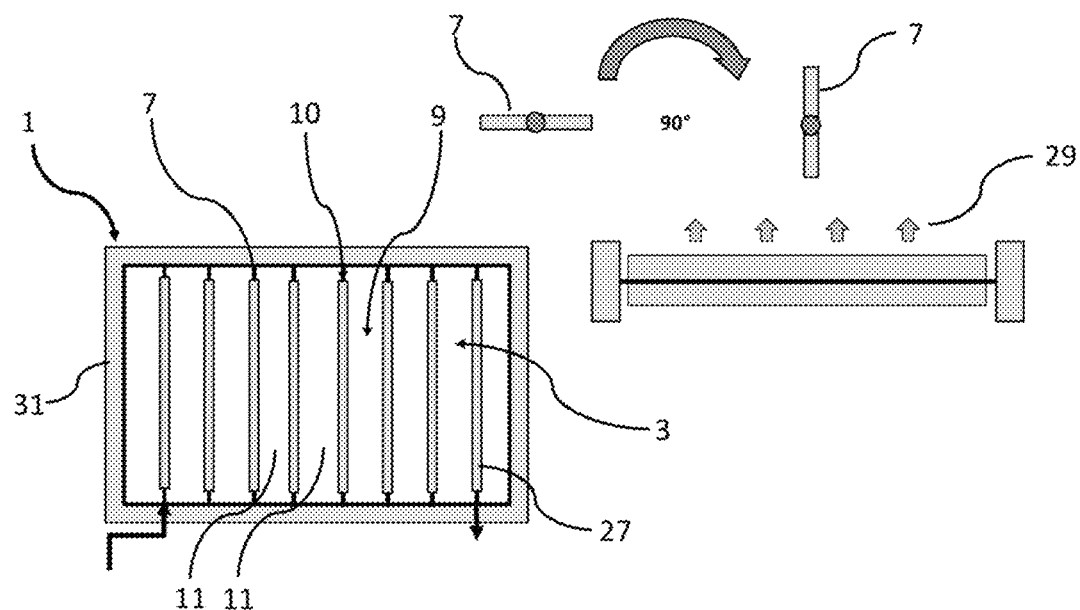
FIG. 6 shows a schematic representation of the IR emitter with a lamellar structure in a first state.

FIG. 6 shows the same embodiment of the modulatable infrared emitter 1 in a first state. Here, the individual lamellae are rotated by 90° with respect to the emission direction by means of preferably an actuator, so that the heatable regions 7 equally no longer point in this direction. The emission area 10 becomes minimal, and the total area 9 is now essentially identical to the non-heatable regions 11. The ratio of the emission area 10 to the total area of the MEMS heating element is minimal, as is the intensity in the emission direction. Thus, it is also implemented that the ratio of the emission area 10 to the total area of the MEMS heating element is lower in the first state than in the second state by at least a factor of 2.

It is noted that various alternatives to the described embodiments of the invention may be used to carry out the invention and arrive at the solution according to the invention. Thus, the infrared emitter according to the invention, the system, and methods and uses thereof are not limited in their embodiments to the foregoing preferred embodiments. Rather, a multitude of embodiments is conceivable, which may deviate from the solution presented. The aim of the claims is to define the scope of protection of the invention. The scope of protection of the claims is directed to covering the infrared emitter according to the invention, the system, methods of their use as well as equivalent embodiments thereof.

LIST OF REFERENCE SIGNS 1 modulatable infrared emitter
3 MEMS heating element
5 actuator
7 heatable regions
9 total area
10 emission area
11 non-heatable regions
13 spring structure
15 housing
17 carriers
19 cover element
21 side parts
23 sealing elements
25 interleaving structure
27 lamellar structure
29 intensity in emission direction
31 frame structure

The invention claimed is:

1. Modulatable infrared emitter comprising:
a heating element, and
an actuator
wherein the heating element is a MEMS heating element comprising heatable regions for emitting infrared radiation in an emission direction which is substantially perpendicular to a total area of the MEMS heating element, the projection of the heatable regions in the emission direction forming an emission area and the area spanned by the MEMS heating element forming the total area, and the actuator being configured to change the shape and/or structure of the MEMS heating element between a first and a second state, so that the ratio of the emission area to the total area of the MEMS heating element is smaller by at least a factor of 2 in the first state than in the second state.

2. Modulatable infrared emitter according to claim 1, wherein the intensity of the infrared radiation emitted by the MEMS heating element in the emission direction is lower in the first state than in the second state by a factor of 2.

3. Modulatable infrared emitter according to claim 1, wherein the MEMS heating element comprises a spring structure and the actuator is a linear actuator configured for compression and/or extension of the spring structure.

4. Modulatable infrared emitter according to claim 1, wherein the MEMS heating element comprises a lamellar structure with rotatable lamellae and the actuator is configured for rotation of the lamellae.

5. Modulatable infrared emitter according to claim 1, wherein the MEMS heating element comprises an interleaving structure and the actuator is a linear actuator configured for varying the interleave.

6. Modulatable infrared emitter according to claim 1, wherein the infrared emitter comprises a housing in which the MEMS heating element and the actuator are present installed, the housing comprising a cover element in which at least one optical filter is additionally present installed.

7. Modulatable infrared emitter according to claim 1, wherein the MEMS heating element comprises a substrate on which at least partially a heatable layer of a conductive material is deposited, on which contacts for a current and/or voltage source are present.

8. Modulatable infrared emitter according to one or more of claim 1, wherein the actuator is a MEMS actuator.

9. Manufacturing method for an infrared emitter according to claim 1, wherein the manufacture of the MEMS heating element comprises the following steps:
    etching of the substrate;
    deposition of a conductive material;
    optionally patterning the substrate to form a MEMS heating element or the conductive material to form a heatable layer; and
    contacting the conductive material.

10. Manufacturing method according to claim 9, wherein etching and/or patterning is selected from the group consisting of dry etching, wet chemical etching, plasma etching, reactive ion etching, and reactive ion deep etching; wherein the deposition is selected from the group comprising consisting of physical vapor deposition, thermal evaporation, laser beam evaporation, arc evaporation, molecular beam epitaxy, sputtering, chemical vapor deposition and atomic layer deposition.

11. System comprising:
    a modulatable infrared emitter according to claim 1, and
    a control device wherein the control device is configured to regulate the actuator to change the shape and/or structure of the MEMS heating element between a first and a second state, such that the ratio of the emission area to the total area of the MEMS heating element is smaller by at least a factor of 2 in the first state than in the second state.

12. System according to claim 11 wherein the control device is configured to regulate the temperature of the heatable regions of the MEMS heating element in a range between 50° C. and 1000° C. and/or the control device is configured to regulate the actuator for an oscillating change of state of the shape and/or structure of the heating element, achieving a modulation frequency of the radiant power of the emitted infrared radiation between 10 Hz and 100 kHz.

13. Method for modulated emission of infrared radiation comprising
    providing a modulatable infrared emitter according to claim 1;
    heating the heatable regions of the MEMS heating element to emit an infrared radiation;
    controlling the actuator to change the shape and/or structure of the MEMS heating element between a first state and a second state, such that the ratio of the emission area to the total area of the MEMS heating element is smaller by at least a factor of 2 in the first state than in the second state.

14. A method of performing photoacoustic spectroscopy and/or infrared spectroscopy comprising using a modulatable infrared emitter according to claim 1.

15. Photoacoustic spectroscope for the analysis of gas, comprising a modulatable infrared emitter according to claim 1,
    an analysis volume fillable with gas and
    an acoustic detector,
    wherein the analysis volume is positioned between the infrared emitter and the acoustic detector so that the infrared radiation modulatably emitted by the infrared emitter can be used for photoacoustic spectroscopy of the gas.

16. Modulatable infrared emitter according to claim 1, wherein the actuator is a MEMS actuator selected from the group comprising electrostatic actuator, piezoelectric actuator, electromagnetic actuator and/or thermal actuator.

17. Modulatable infrared emitter according to claim 1, wherein the actuator is an electrostatic MEMS-actuator in the form of a comb drive based on a variation of the comb overlap and/or the comb spacing.

18. System according to the claim 11 wherein the control device is configured to regulate the actuator for an oscillating change of state of the shape and/or structure of the heating element.

19. System according to claim 1, wherein the control device is configured to regulate the actuator for an oscillating change of state of the shape and/or structure of the heating element achieving a modulation frequency of the radiant power of the emitted infrared radiation between 10 Hz and 100 kHz.

* * * * *